United States Patent
Frey et al.

(10) Patent No.: US 7,176,540 B2
(45) Date of Patent: Feb. 13, 2007

(54) METHOD FOR PRODUCING MICROMECHANICAL STRUCTURES AND A MICROMECHANICAL STRUCTURE

(75) Inventors: Wilhelm Frey, Palo Alto, CA (US); Christoph Duenn, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 188 days.

(21) Appl. No.: 10/817,346

(22) Filed: Apr. 2, 2004

(65) Prior Publication Data

US 2004/0256684 A1 Dec. 23, 2004

(30) Foreign Application Priority Data

Apr. 2, 2003 (DE) .................... 103 14 989

(51) Int. Cl.
*H01L 21/00* (2006.01)
(52) U.S. Cl. .............. 257/414; 257/418; 257/347
(58) Field of Classification Search ........ 257/414, 257/418, 347
See application file for complete search history.

(56) References Cited

U.S. PATENT DOCUMENTS

| | | | | |
|---|---|---|---|---|
| 6,512,252 B1* | 1/2003 | Takagi et al. | ........... | 257/192 |
| 6,753,555 B2* | 6/2004 | Takagi et al. | ........... | 257/192 |
| 6,949,451 B2* | 9/2005 | Yeo et al. | ........... | 438/479 |
| 7,084,051 B2* | 8/2006 | Ueda | ........... | 438/518 |
| 2003/0052348 A1* | 3/2003 | Takagi et al. | ........... | 257/288 |
| 2004/0018701 A1* | 1/2004 | Ueda | ........... | 438/518 |
| 2004/0178447 A1* | 9/2004 | Yeo et al. | ........... | 257/347 |
| 2004/0212013 A1* | 10/2004 | Takagi et al. | ........... | 257/347 |
| 2004/0256684 A1* | 12/2004 | Frey et al. | ........... | 257/414 |
| 2005/0003599 A1* | 1/2005 | Yeo et al. | ........... | 438/200 |
| 2005/0196925 A1* | 9/2005 | Kim et al. | ........... | 438/285 |
| 2005/0275024 A1* | 12/2005 | Yeo et al. | ........... | 257/347 |

FOREIGN PATENT DOCUMENTS

JP 09-082944 * 3/1997

* cited by examiner

*Primary Examiner*—Laura M. Schillinger
(74) *Attorney, Agent, or Firm*—Kenyon & Kenyon LLP

(57) ABSTRACT

A method for producing micromechanical structures, in which a functional layer is deposited onto a sacrificial layer, and the sacrificial layer is removed again for the production of at least one mechanical functional element, which is characterized by a surface barrier layer, with which the functional layer begins on the sacrificial layer, and which has a different state from the remaining functional layer, is also removed at least to a considerable part, or, on the functional layer, one layer or a plurality of layers having at least approximately the same properties with respect to stress in the layer or layers such as the surface barrier layer is (are) applied. Additionally, a micromechanical structure having a functional layer in which the functional layer is constructed in such a way that the stresses are neutralized or no stress gradient appears.

4 Claims, 1 Drawing Sheet

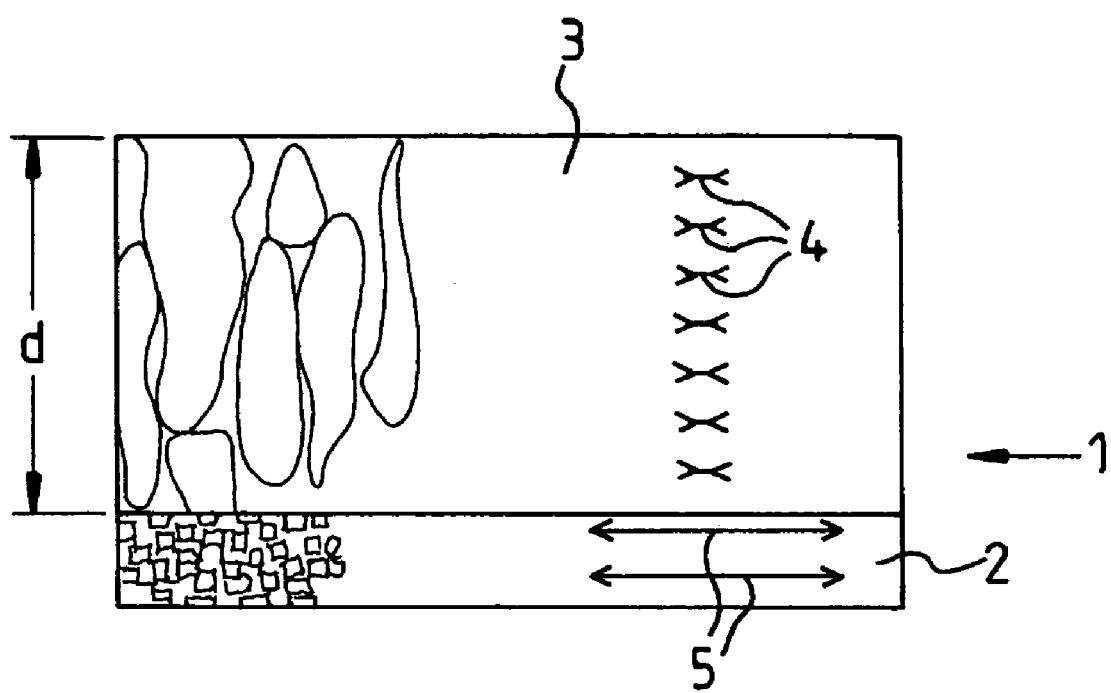

METHOD FOR PRODUCING MICROMECHANICAL STRUCTURES AND A MICROMECHANICAL STRUCTURE

BACKGROUND INFORMATION

Micromechanical systems may be produced based on multiple material combinations. The production may take place especially using the materials SiGe and Ge. In the case of integrated micromechanical systems, on a regular basis a combination is involved of electronic and mechanical components (e.g. resonators, acceleration sensors and yaw rate sensors). Onto the electronic components, as a rule, a printed circuit trace interconnect layer is applied to connect the mechanical and electronic components. Above that, there is a sacrificial layer, which, in SiGe technology is preferably made of Ge. On top of the sacrificial layer an SiGe functional layer is situated, of which the mechanical components are implemented.

At present, the SiGe functional layer is mostly deposited using the LPCVD method (LPCVD standing for low pressure chemical vapor deposition). Other methods, which are also used, are epitaxial growth or PECVD (plasma enhanced chemical vapor deposition). However, these methods have not yet advanced sufficiently. The advantages of LPCVD deposition are the low deposition temperature for applying polycrystalline layers, which are particularly important for a "backend integration". By backend integration is meant the construction of the mechanical components on the electronic components. In addition, the LPCVD method is particularly good for batch processing. One disadvantage of the LPCVD layers is that they have a comparatively high stress gradient. Because of this stress gradient, for example, the individual digits of a comb structure no longer overlap over the entire thickness of the layer or the whole length of the digits, so that the latter's function may be impaired. In the extreme case, at great stress gradients, even movable elements on a substrate are abrasively trimmed.

At this time it is not possible sufficiently to reduce a disadvantageous layer stress gradient during the LPCVD SiGe depositing without exceeding depositing parameter boundaries, such as CMOS-compatible deposit temperatures, or having to use extremely tight process windows which, at the present time, can hardly be kept stable over an entire wafer surface. However, with the current high stress gradients it is not possible to construct acceleration sensors or yaw rate sensors having a large sensor surface and thus also a high resolution. But it is just this area that one would like to open up using the integration of micromechanics and microelectronics. In SiGe technology, the high stress gradient of functional layers is currently the main reason why there is not yet a large number of integrated micromechanical systems, although the integration with SiGe is a key technology for a large number of new fields of application.

SUMMARY OF THE INVENTION

The present invention is based on the object of improving the functionality of mechanical components in micromechanical systems, such as micromechanical systems especially in the use of SiGe technology, so that even producing comparatively large sensor surfaces, having a high resolution, is possible.

This object is achieved through the features of the present invention.

First of all, the present invention starts out from a method for producing micromechanical structures in which a functional layer is deposited onto a sacrificial layer, and, for the production of at least one mechanical functional element, the sacrificial layer is removed again. A first important aspect of the present invention is that a surface barrier layer, which is the beginning of the functional layer on the sacrificial layer, and which has a different state from the remainder of the functional layer, is also removed at least to a considerable part. This procedure is based on the realization that the stress gradient in known structures is essentially caused by the fact that the layer stress at the under side of the layer is different from that at the upper side of the layer, so that free (SiGe, for example) bars arch upwards by a multiple of the layer thickness, and in addition, the difference in the layer stress is caused more or less exclusively by a comparatively thin surface barrier layer on the under side of the functional layer, which, upon the production of the functional layer differs from the remaining functional layer. As a rule, at the under side of the functional layer a compressive stress appears, while at the upper side a low compressive stress or a tensile stress prevails. Thereby is caused, based on this stress difference, a deflection of, for example, bars fixed on one side or a bending of structures that are lying free in an upward direction, that is, for example, away from a carrier in the direction of the layer surface.

The reason for the behavior of the surface barrier layer in the functional layer, which results in the stress gradient having the described effects, is that the crystal structure changes during the depositing. In a manner relatively independent of depositing parameters, mostly an amorphous or very fine crystalline surface layer barrier forms first of all, which has a thickness of between a few 10 nm and a few 100 nm. Along with increasing depositing, the crystallites in the layer keep on becoming bigger, the change in the crystal growth after a certain layer thickness (surface barrier layer), however, not being so great, or changes no longer take place. Thus, the section of the layer in this area of the functional layer is relatively homogeneous with respect to crystal structure. Since the mechanical stress (as well as the thermal coefficient of expansion) of a layer depends very greatly on the crystal structure, the fine-crystalline or amorphous surface barrier layer shows a different stress than the subsequent polycrystalline main layer of the functional layer. That explains why mainly the area of the surface barrier layer is responsible for having the entire functional layer bending, such as upwards, based on a stress gradient. According to the present invention, the surface barrier layer is now removed in the lower region of the functional layer, whereby the cause of the stress gradient is also eliminated. Such a method may be used for all micromechanical structures, and does not necessarily have to be limited to integrated micromechanical systems. The removal of the surface barrier layer may be performed in different ways. What is common to all of them is that the sacrificial layer must really be removed totally or at least partially, since otherwise the surface barrier layer is not freely accessible, and then cannot be removed.

The sacrificial layer is normally made of a material which is able to be etched to become the functional layer while having a greater or lesser selectivity. That has the advantage that when the sacrificial layer is removed, the functional layer is attacked almost not at all, or to an inconsiderable extent. Say the sacrificial layer is made of Ge, and the functional layer of SiGe, the germanium proportion being less than 65% to 70%, in order to achieve sufficient selectivity during sacrificial layer etching between the sacrificial layer and the functional layer. Besides $H_2O_2$, almost every other oxidizing fluid is suitable as the sacrificial layer etching agent. The sacrificial layer does not necessarily have to be made of Ge, it may also be constructed of SiGe having a high proportion of germanium. Besides that, other materials, such as silicon dioxide, come into consideration. In that case, hydrofluoric acid (HF) may be used for etching the sacrificial layer. In the case of a comparatively low germanium proportion (less than 65% to 70%) in the functional layer, the surface barrier layer may be removed wet-chemically, using etching agents which are used for etching silicon, such as TMAH (tetramethylammonium hydroxide), after the sacrificial layer has been removed. But chemically removing the starting layer using gaseous substances such as $ClF_3$, $XeF_2$ or even in a plasma having an isotropic etching effect is also conceivable. For plasma etching, $SF_6$, for example, is suitable. Using such a gas phase method, the etching of the sacrificial layer itself may be carried out, if prior to that, the actual functional elements are suitably passivated.

If the germanium proportion is greater than 65% to 70%, then during the sacrificial layer etching of, for example, a pure germanium sacrificial layer using, for instance, $H_2O_2$, the functional layer is also attacked. This may be used purposefully in order to remove the surface barrier layer already during the etching of the sacrificial layer. In this case, then, no additional step is necessary for reducing the stress gradient. The selectivity between the sacrificial layer and the functional layer may be set exactly by the germanium content (e.g. germanium content gradient) of the functional layer.

Let the sacrificial layer be made of germanium and the functional layer be made of SiGe having a germanium proportion of greater than 65%, which is constant over the entire thickness of the layer. The depositing conditions for the germanium sacrificial layer, which may be, for example, made of two layers, may, for example, for an LPCVD oven be 400° C., 400 mTorr process pressure, 190 sccm $Si_2H_6$ gas flow for a duration of ten minutes for a germanium starting layer, and 400° C., 400 mTorr pressure and 190 sccm $GeH_4$ gas flow for the germanium sacrificial layer itself. As parameters for the functional layer, for example, 425° C., 400 mTorr pressure, and for the gas flows 100 sccm $SiH_4$, 70 sccm $GeH_4$ and 60 sccm $B_2H_6$ come into consideration. If this sacrificial layer is etched with $H_2O_2$, one automatically removes the lower layer of the functional layer and thereby also removes the stress gradient. The selectivity between such a combination of sacrificial layer and functional layer is of an order of magnitude of 1:50. The selectivity and etching time of the sacrificial layer here determines the thickness of the layer removed from the functional layer. Using the present method, for example, 3.5 μm-thick and 500 μm-long bars, made of an appropriately produced functional layer, bend through by less than 1.5 μm with respect to a plane. In this context, the bars having the greatest evenness may demonstrate deflections of less than 0.4 μm per 500 μm bar length. These values are achieved in various boot positions even on wafers, since the method is relatively robust with respect to changes in depositing parameters. However, the deflection of bars whose lower layer was not removed is typically more than ten times as great. In addition, comparatively large divergences may appear from wafer to wafer.

In one further preferred embodiment of the present invention, the functional layer is applied in a composition of the surface barrier layer as seen in the direction of the remaining functional layer, so that at least a part of the surface barrier layer is able to be etched at least initially selective to the remaining surface barrier layer and/or to the remaining functional layer. By this procedure, the surface barrier layer, for example, may be developed into a sacrificial layer with a relatively small, or no selectivity, whereby, during sacrificial layer etching, the surface barrier layer is removed at the same time, but the functional layer is hardly removed, or not at all.

In particular, it is preferred if the functional layer, in at least one partial area of the surface barrier layer, is deposited, into the remaining functional layer, made of SiGe having a higher proportion of germanium than 65% to 70% but less than 100%, and during the depositing for the remaining functional layer the germanium proportion is reduced, preferably to a proportion of less than 65% to 70%. For example, in one and the same oven deposit, directly one after another, without stabilization layers lying in between, the surface barrier layer and the remaining functional layer are deposited. To do this, for example, during the depositing, the flow of germanium is simply lowered after a specified time. In one preferred embodiment of the present invention, a layer having a germanium content of more than 65% to 70%, but clearly less than 100% may be deposited in approximately the thickness of the surface barrier layer, which is responsible for the stress gradient.

Directly upon this, then, the functional layer may be deposited, having a lower germanium content for improved selectivity during sacrificial layer etching. Consequently, during the etching of the sacrificial layer, only the surface barrier layer having a high germanium proportion is removed, but no, or essentially no areas of the functional layer. Consequently, right on target, only the layer of the functional layer is removed which causes the stress gradient, without one having to adhere to exact time windows in the etching, in this context.

Starting from a method for producing micromechanical structures in which a functional layer is deposited onto a sacrificial layer, and for the production of at least one mechanical functional element the sacrificial layer is removed again, the object is also attained in that one layer or several layers, having at least closely the same properties with respect to layer stress in the layer or the layers as seen together as a surface barrier layer, with which the functional layer begins on the sacrificial layer and which has a different condition from the remaining functional layer, is/are applied to the functional layer. Hereby are produced layers having the same stress, on opposite surface areas of the functional layer, whereby, using a uniform layer between these layers, a stress neutralization takes place so that no undesired twisting appears. The application of the additional layer or the layers onto the functional layer may, for example, be made so that the depositing process is simply stopped and started again. Thereby is created naturally on the functional layer a layer which at least approximately has the same properties as the surface barrier layer has to the sacrificial layer, since the surface barrier layer was also generated by starting up the process having predefined depositing parameters. In response to each start-up after a stop, a layer will at first be formed which corresponds to the surface barrier layer of the functional layer, if the initial conditions of the two layers are compatible. This can be achieved, for instance, by a starting layer made of amorphous silicon.

However, it is also possible to apply another layer onto the functional layer if the former only has stress behavior that corresponds to the surface barrier layer. Thereby the desired stress neutralization in the functional layer is then achieved. The production methods described have the advantage that thereby functional layers may be generated having comparatively low stress gradients under CMOS-compatible production conditions. The methods are comparatively robust with respect to fluctuations in the depositing parameters, since the stress gradient is not set via the germanium content, the pressure, the temperature of the doping concentration or even a gradient of these parameters. This makes carrying out the process extraordinarily simplified, particularly for batch processes, such as in an LPCVD oven depositing. At the same time, the depositing parameters may be chosen in such a way that the layers are deposited at a comparatively high rate, which is of advantage with regard to economical efficiency. Besides that, fewer test runs are required in establishing a manufacturing method, since manufacturing methods according to the present invention "function" in a large process window.

Also, starting from a micromechanical structure having a functional layer made of SiGe, which, in a lateral region, is especially completely separated from the remainder of the structure, the object is attained in that the functional layer, viewed over its thickness, has such a structure that stresses in the layer are neutralized for the most part, or no stress gradient makes an appearance. That is based on the above-described realization that stress gradients in the functional layer are regularly caused only by a thin layer whose effect may be offset by a layer having appropriate properties.

In the simplest case, the functional layer is preferably constructed at least approximately symmetrical to a center plane through the layer, as seen over its thickness. In a symmetrical layer construction, one may largely assume that a stress-neutral behavior of the layer sandwich appears, towards the outside.

In this connection, it is also advantageous if, with respect to the method described, the functional layer has a surface barrier layer whose effect causing stress gradients is neutralized by an appropriate layer on the upper side.

In the simplest case, the functional layer, as viewed in cross section, is homogeneous, at least for the most part. A layer that is per se homogeneous is of necessity stress-neutral. In the case of minor inhomogeneities, a residual stress will set in which, however, frequently is acceptable.

BRIEF DESCRIPTION OF THE DRAWING

The FIGURE shows an exemplary embodiment of a layer construction for illustrating the present invention.

DETAILED DESCRIPTION

In a schematic cross section, the FIGURE shows a typical construction of an SiGe functional layer 1. Functional layer 1 has on its lower side a surface barrier layer 2, which is made up of amorphous or very small crystallites. Remaining functional layer 3 is next to surface barrier layer 2. Remaining functional layer 3 is made up of comparatively large crystallites, which to a great extent are uniform over the entire thickness of this layer. Therefore, this layer, as seen over its thickness d, has an essentially constant layer stress. The constant layer stress is either a comparatively slight tensile stress or compressive stress, which are symbolized by arrows 4 in layer 3.

By contrast, in surface barrier layer 2, a substantially greater compressive stress prevails (symbolized by arrows 5), with the result that the layer in the FIGURE bends up towards the top.

According to the present invention, only two types of thing can happen, then.

1. Either surface barrier layer 2 is removed, whereby a remaining functional layer 3 is obtained, which is per se largely homogeneous, and, in view of that, shows no substantial stress gradients, which would lead to an undesired deformation of the layer.

2. One or more additional layer(s) is/are applied to layer 3, which has (have) comparable stress properties to surface barrier layer 5. Hereby the high compressive stresses in the surface barrier layer are able to be compensated for by correspondingly high compressive stresses on the upper side of the layer construction.

What is claimed is:

1. A micromechanical structure comprising:
   a functional layer composed of SiGe;
   a remaining structure; and
   a lateral region separating the functional layer from the remaining structure,
   wherein the functional layer, as seen over its thickness, has a construction so that one of (a) stresses in the functional layer are neutralized, at least for the most part, and (b) no stress gradient appears.

2. The structure according to claim 1, wherein the functional layer, as seen over its thickness, is constructed at least approximately symmetrically to a center plane through the functional layer.

3. The method according to claim 1, further comprising a remaining functional layer, and wherein the functional layer in each case has a surface barrier layer on opposite surfaces, which differs from the remaining functional layer.

4. The method according to claim 1, wherein the functional layer is at least approximately homogeneous, as seen over its cross section.

* * * * *